(12) United States Patent
Richter

(10) Patent No.: US 9,934,899 B2
(45) Date of Patent: Apr. 3, 2018

(54) ELECTRONICS SYSTEM AND METHOD OF FORMING SAME

(71) Applicant: SCHNEIDER ELECTRIC SOLAR INVERTERS USA, INC., Livermore, CA (US)

(72) Inventor: Jeff Richter, Coquitlam (CA)

(73) Assignee: SCHNEIDER ELECTRIC SOLAR INVERTERS USA, INC., Livermore, CA (US)

( * ) Notice: Subject to any disclaimer, the term of this patent is extended or adjusted under 35 U.S.C. 154(b) by 19 days.

(21) Appl. No.: 14/896,711

(22) PCT Filed: Jun. 10, 2013

(86) PCT No.: PCT/US2013/044990
§ 371 (c)(1),
(2) Date: Dec. 8, 2015

(87) PCT Pub. No.: WO2014/200459
PCT Pub. Date: Dec. 18, 2014

(65) Prior Publication Data
US 2016/0133372 A1    May 12, 2016

(51) Int. Cl.
*H05K 13/04* (2006.01)
*H01F 27/06* (2006.01)
(Continued)

(52) U.S. Cl.
CPC .......... *H01F 27/06* (2013.01); *H01F 27/025* (2013.01); *H01F 27/027* (2013.01); *H01F 27/08* (2013.01);
(Continued)

(58) Field of Classification Search
CPC ................ H05K 3/325; H01F 27/06
(Continued)

(56) References Cited

U.S. PATENT DOCUMENTS 2,984,774 A * 5/1961 Race ............... H01L 23/4006
165/185
3,905,000 A    9/1975 Walter
(Continued)

FOREIGN PATENT DOCUMENTS

DE    3902230 A1    8/1990
DE    29823886 U1    3/2000
(Continued)

OTHER PUBLICATIONS

*English translation of the reference Haberstroh*
(Continued)

*Primary Examiner* — Dion R Ferguson
*Assistant Examiner* — Mandeep S Buttar
(74) *Attorney, Agent, or Firm* — Lando & Anastasi, LLP

(57) ABSTRACT

Embodiments disclosed herein include systems and methods for mounting electrical components in electrical systems. In one example, there is provided a heat-generating electrical component and base assembly configured to be secured to a component wall. The assembly comprises a base including an upper portion having a recess and a lower portion having a floating electrical connector, a heat-generating electrical component secured in the recess of the base and including an electrical lead in electrical communication with the floating electrical connector, and a gasket circumscribing a perimeter of the lower portion.

15 Claims, 8 Drawing Sheets

(51) Int. Cl.
    H01F 27/08    (2006.01)
    H05K 5/06     (2006.01)
    H05K 7/20     (2006.01)
    H01F 27/02    (2006.01)
    H05K 5/00     (2006.01)
    H05K 5/02     (2006.01)
    H05K 13/00    (2006.01)
    H05K 3/32     (2006.01)

(52) U.S. Cl.
    CPC ........ *H05K 5/0026* (2013.01); *H05K 5/0217* (2013.01); *H05K 5/0247* (2013.01); *H05K 5/069* (2013.01); *H05K 7/20145* (2013.01); *H05K 7/20181* (2013.01); *H05K 7/20209* (2013.01); *H05K 7/20909* (2013.01); *H05K 13/0023* (2013.01); *H05K 13/04* (2013.01); *H05K 3/325* (2013.01); *H05K 2201/0999* (2013.01); *H05K 2201/10409* (2013.01)

(58) Field of Classification Search
    USPC .................................. 361/697, 752; 336/65
    See application file for complete search history.

(56) References Cited

U.S. PATENT DOCUMENTS

| | | | |
|---|---|---|---|
| 3,909,679 A * | 9/1975 | Petri | H05K 7/20409 361/709 |
| 4,602,122 A | 7/1986 | Lint | |
| 4,754,250 A | 6/1988 | Duin | |
| 4,924,200 A | 5/1990 | Kitahara et al. | |
| 5,670,924 A | 9/1997 | Heinrich | |
| 6,392,519 B1 | 5/2002 | Ronning | |
| 6,412,754 B1 | 7/2002 | Ogino et al. | |
| 7,619,899 B2 * | 11/2009 | Rubenstein | H05K 1/141 361/740 |
| 2003/0184948 A1 | 10/2003 | Settergren et al. | |
| 2007/0153485 A1 | 7/2007 | Caines et al. | |
| 2008/0146092 A1 | 6/2008 | Taylor et al. | |
| 2009/0277682 A1 * | 11/2009 | Bungo | H05K 3/284 174/521 |
| 2011/0215891 A1 * | 9/2011 | Sundstrom | H01F 27/04 336/65 |
| 2012/0119864 A1 | 5/2012 | Lint | |
| 2012/0319810 A1 * | 12/2012 | Tseng | H01F 27/027 336/65 |
| 2013/0009738 A1 * | 1/2013 | Chen | H01F 27/29 336/65 |
| 2014/0049858 A1 * | 2/2014 | Kasper | B60R 16/02 361/1 |
| 2014/0191834 A1 * | 7/2014 | MacLennan | H01F 27/08 336/58 |
| 2015/0294777 A1 * | 10/2015 | Mayerhofer | H01F 27/04 336/83 |

FOREIGN PATENT DOCUMENTS

| | | |
|---|---|---|
| EP | 0449640 A1 | 10/1991 |
| EP | 0783172 A2 | 7/1997 |
| JP | H0626141 U | 4/1994 |

OTHER PUBLICATIONS

English translation of the reference Haberstroh.*
Extended European Search Report from corresponding European Application No. 138867031 dated Dec. 22, 2016.
Notification of Transmittal of the International Search Report and the Written Opinion of the International Searching Authority from corresponding PCT/US2013/044990 dated Feb. 3, 2014.

* cited by examiner

ELECTRONICS SYSTEM AND METHOD OF FORMING SAME

CROSS-REFERENCE TO RELATED APPLICATIONS

This application is a U.S. National Stage Application under 35 U.S.C. § 371 of International Application No. PCT/US2013/044990, filed Jun. 10, 2013, titled AN ELECTRONICS SYSTEM AND METHOD OF FORMING SAME, which is hereby incorporated herein by reference in its entirety.

BACKGROUND

Electrical systems may include components including electronic components, for example, transistors or integrated circuits and heat-generating components including, for example, resistors, inductors, or transformers. These electronic components and heat-generating components may be electrically connected on a common circuit board. Cooling systems may be provided to facilitate maintaining the electrical system at a temperature within a desired range and to keep heat generated by one or more components of the system from damaging that component or other components of the system.

SUMMARY

In accordance with a first aspect, there is provided a heat-generating electrical component and base assembly configured to be secured to a component wall. The assembly comprises a base including an upper portion having a recess and a lower portion having a floating electrical connector, a heat-generating electrical component secured in the recess of the base and including an electrical lead in electrical communication with the floating electrical connector, and a gasket circumscribing a perimeter of the lower portion.

In some embodiments, the assembly further comprises a potting material securing the heat-generating electrical component in the recess.

In some embodiments, the floating electrical connector is disposed within a substantially cylindrical retaining body disposed in the lower portion of the base.

In some embodiments, the floating electrical connector comprises a lug/captive nut assembly including a nut retained within the substantially cylindrical retaining body by a lug in electrical communication with the electrical lead of the heat-generating electrical component.

In some embodiments, the assembly further comprises an aperture disposed in a projection extending from a sidewall of the base above a lower extent of the lower portion, the aperture configured to receive a mounting connector configured to secure the assembly to the component wall.

In some embodiments, the heat-generating electrical component comprises an inductor.

In some embodiments, the lower portion of the base is configured to extend through an aperture in the component wall upon securing the assembly to the component wall.

In some embodiments, the gasket is configured to form a hermetic seal about the aperture in the component wall upon securing the assembly to the component wall.

In some embodiments, the assembly comprises a plurality of heat-generating electrical components mounted in the base.

In accordance with another aspect, there is provided an electronics system comprising an enclosure including a first side and a second side separated from the first side by an enclosure partition, a heat-generating electrical component disposed in the first side of the enclosure, and a circuit board including a plurality of electronic components disposed in the second side of the enclosure and in electrical communication with the heat-generating electrical component by an electrical conductor passing through the enclosure partition.

In some embodiments, the first side is a plenum open to atmosphere.

In some embodiments, the second side is a climate controlled region.

In some embodiments, the heat-generating electrical component is mounted in a base including a floating electrical connector.

In some embodiments, the floating electrical connector comprises a lug/captive nut assembly including a nut retained within a substantially cylindrical body formed in the base by a lug.

In some embodiments, the base includes a groove housing a gasket configured to form a hermetic seal with the enclosure partition.

In some embodiments, the groove circumscribes a lower portion of the base which includes the lug/captive nut.

In some embodiments, the lower portion passes through an aperture in the enclosure partition.

In some embodiments, the heat-generating electrical component is disposed in a recess in an upper portion of the base and retained therein with a potting material.

In some embodiments, the base includes an aperture formed in a protrusion extending from a sidewall of the base, the aperture configured to retain a connector securing the base to the enclosure partition.

In some embodiments, the system includes a plurality of heat-generating electrical components mounted in a common base.

In some embodiments, the electrical conductor is in electrical communication with a solder pad on a surface of the circuit board and with the floating electrical connector.

In some embodiments, the electrical conductor comprises a threaded connector.

In some embodiments, the heat-generating electrical component comprises an inductor.

In accordance with another aspect, there is provided a method of forming an electrical system. The method comprises inserting a heat-generating electrical component into a recess of a base, placing a floating electrical connector into a retaining body formed in the base, capturing the floating electrical connector within the retaining body by disposing a lug secured to an end of an electrical lead of the heat-generating electrical component over an opening of the retaining body, and mounting the base to a first side of an electrical assembly enclosure partition.

In some embodiments, the method further comprises mounting a circuit board to a second side of the electrical assembly enclosure partition.

In some embodiments, the method further comprises electrically connecting the floating electrical connector to an electrical connection on the circuit board with a connecting element passing through an aperture in the circuit board and engaging the floating electrical connector.

In some embodiments, the method further comprises securing the heat-generating electrical component in the recess in the base with a potting material.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
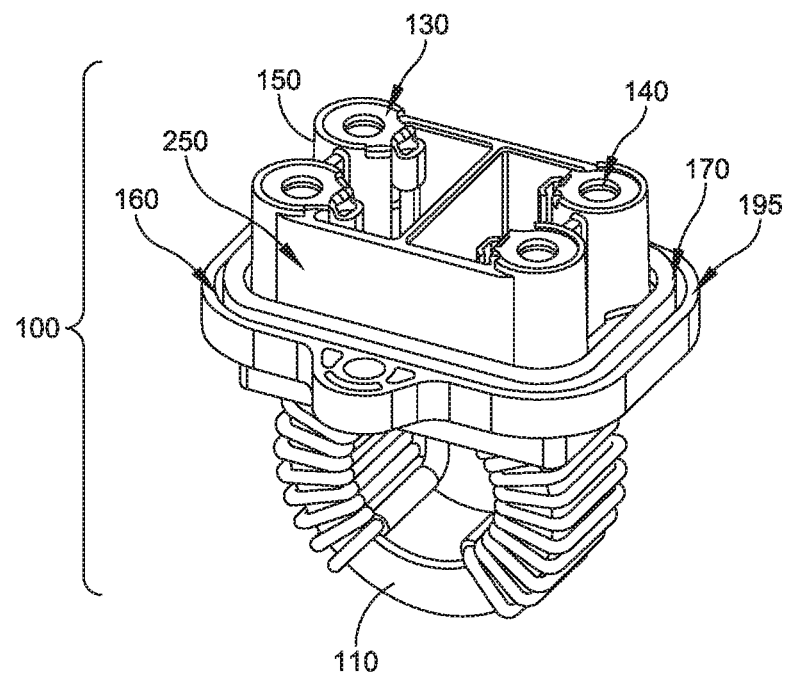
FIG. 1A is an isometric view from a bottom of an inductor mounted in a base forming an inductor/base assembly in accordance with an embodiment.

Aspects and embodiments disclosed herein are not limited to the details of construction and the arrangement of components set forth in the following description or illustrated in the drawings. The disclosed apparatus and methods are capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

Various electronic systems may include sensitive electronic components whose performance may be degraded or whose lifetime may be reduced by exposure to high temperatures and/or to humid or dusty environments. Electronic systems may include various components which produce a significant amount of heat during use, for example, transformers, resistors, transistors, and/or inductors. Electronic circuits used in high power applications may be particularly susceptible to the heating of various components and may desirably be subject to cooling to maintain the temperature of the electronic components of the system within a desired range. Embodiments disclosed herein may be applicable to high power electronic systems including, for example, inverters, which may be utilized in systems such as power conversion systems including, for example, solar power conversion systems.

One method of connecting a heat-generating component to a circuit board includes soldering the component directly to the circuit board and in some implementations, also physically securing the component to the circuit board with tie-wraps, an adhesive, for example, room temperature vulcanizing (RTV) silicone, brackets, or other mechanical fasteners. This method has various disadvantages. A heat-generating component mounted directly to a circuit board will add heat to an enclosure in which the circuit board may be disposed. The heat produced by the heat-generating component may reduce the reliability and/or life of sensitive electronics on the circuit board unless the enclosure is properly cooled. Electronics on the circuit board may also be sensitive to moisture and dust, so any cooling or venting to the atmosphere would desirably prevent the ingress of these contaminants.

Cooling systems including filters on fans and exhausts may be utilized to cool a circuit board including sensitive electronic components while also protecting the sensitive electronics from exposure to moisture and/or dust. Cooling system filters, however, are desirably replaced at certain operating intervals to maintain the operating efficiency of the cooling system. Thus, cooling systems including filters may not be the best solution for cooling an electronic system including a circuit board having sensitive electronic components, especially if the electronic system is located in a remote location.

In some high power electronic systems including heat-generating components, for example, power inductors, power resistors, or transformers and heat and/or dust sensitive electronic components, it may be desirable that the heat-generating components be mounted away from the heat and/or dust sensitive electronics. The heat and/or dust sensitive electronics may require little air flow to remove heat and may be maintained at a controlled environment. The heat-generating components may be less sensitive to dust and/or moisture than the heat and/or dust sensitive electronics and may be provided with cooling air which does not require stringent control over temperature or humidity. Separation of the heat and/or dust sensitive electronics from the heat-generating components may be achieved by splitting an enclosure for the electronic system into two sections: a sealed, and in some implementations, environmentally controlled (for example, temperature and/or humidity controlled) electronics section which contains the sensitive electronics and a "plenum" section for the heat-generating components. In some embodiments, the plenum includes heat sinks and may be provided with a forced air cooling system, for example, a fan, to cool the heat-generating components contained therein. In some embodiments, the plenum section is open to the atmosphere to facilitate the circulation of air about the heat-generating components. Placing the heat-generating components in the plenum section separates them from the sensitive electronics while providing a means to cool them without contaminating the sensitive electronics.

In some electronic systems, it is desirable to place heat-generating components in a separate part of an enclosure from sensitive electronics while providing a simple, cost effective, and easy-to-assemble method to electrically connect the heat-generating components to a circuit board or circuit boards on which the sensitive electronics are mounted. In some embodiments, the heat-generating components may be mounted to a wall of a first section of an enclosure, for example, a plenum, which divides the enclosure into a first section including the plenum and a second section in which the sensitive electronics may be mounted.

Individual wires from the heat-generating components may be routed through the dividing enclosure wall and terminated on circuit board(s) on which the sensitive electronics are mounted using, for example, terminal lugs. The wires are, in some embodiments, fed through grommets in apertures in the dividing enclosure wall that protect the wires and maintain a seal between the two enclosure sections. In such embodiments, however, the wires from the heat-generating components may be required to be routed within the electronics section of the enclosure to the point of termination on the circuit board, thereby complicating the assembly process.

Other embodiments disclosed herein provide for the mounting, sealing, and electrical interconnection of heat-generating components in a first enclosure section of an enclosure assembly which does not require the routing of individual wires through enclosure walls, yet still maintains an environmental seal between the first enclosure section and a second enclosure section containing sensitive electronics. Some embodiments provide for inductors and/or other heat-generating electrical components to be mounted in an air-cooled first portion of an enclosure (such as a plenum) while allowing an easy to assemble, direct electrical interconnection to circuit board(s) located within an environmentally sealed and/or climate controlled second portion of the enclosure. Some embodiments include mounting inductors and/or other heat-generating components in an area of an enclosure where they are separated from a main enclosure housing the other electronics of the electronic system, allowing the inductors and/or other heat-generating components to be cooled without contaminating the delicate electronics in the main enclosure. This results in overall increased efficiency and increased reliability. Some embodiments disclosed herein provide advantages including, for example, simple electrical connection of heat-generating components to circuit boards including other electronic components, the elimination of the need to solder heavy heat-generating components on the circuit boards, and the elimination of a need to connect heat-generating components to the circuit boards with separate power cables.

In some embodiments heat-generating electrical components are mounted in a fan cooled section of an electronics system enclosure, separate from the rest of the electronics in the system. Some electronics in the electronics system are sensitive to heat and humidity and are desirably maintained in an environment having a minimum of IP54 particle and moisture protection.

In some embodiments one or more heat-generating components are mounted in a base or bases that incorporate both a moisture seal and electrical terminations which provides for placement of the heat-generating components in a plenum of an electronic system enclosure. The base or bases including the heat-generating electrical components may be mounted to a wall of the plenum located directly opposite termination points for electrical connection for the heat-generating electrical components on circuit boards including other components, for example, heat and/or moisture sensitive electronic components located on another side of the wall of the plenum. In some embodiments, electrical connections for the heat-generating electrical components on the base comprise fixed female threaded stand-off electrical connectors. The fixed female threaded stand-off electrical connectors are in some embodiments terminated with a ring lug. The stand-off electrical connectors protrude from the base and make electrical connection with threaded male fasteners which pass through a wall of the plenum and make electrical contact with mounting points, for example solder pads, on a circuit board on the opposite side of the plenum wall from the base. In other embodiments, the electrical connectors comprise floating stand-offs. The provision of floating stand-offs reduces the probability that any deviation in distance between the stand-offs and the circuit board mounting points would result in a deflection of the circuit board. In some embodiments, the floating stand-offs include floating ring lug/captive nut assemblies.

Embodiments of mounting systems for heat-generating components of electrical systems are illustrated in greater detail in the appended figures and the descriptions of these figures provided below. In these embodiments, the heat-generating components are located in a first section of an enclosure separated by a wall from a second section of the enclosure where circuit boards including other electronic components of the electrical systems are disposed. The heat-generating components are illustrated as inductors, however, embodiments of the present disclosure are equally applicable to mounting systems for other heat-generating electrical components, for example, transformers, resistors, and/or transistors.

Figure 1B:
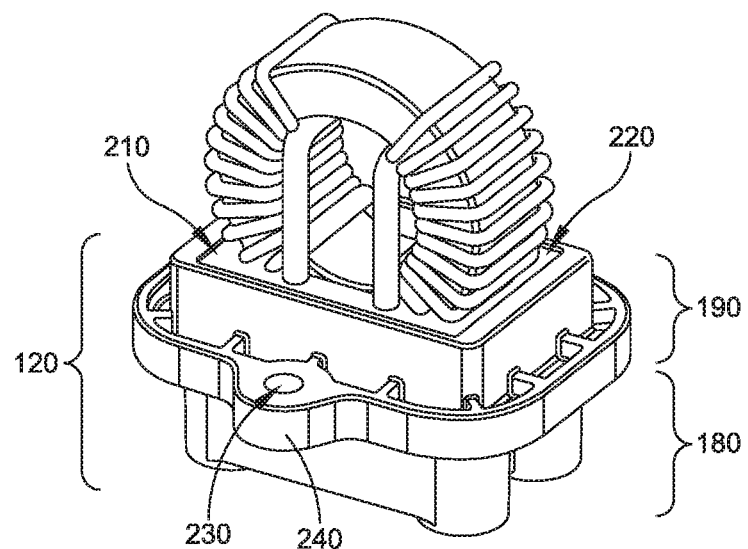
FIG. 1B is an isometric view from a top of the inductor/base assembly of FIG. 1A.

FIG. 1A is an isometric view from the bottom of an inductor mounted in a base forming an inductor/base assembly 100 in accordance with an embodiment of the present disclosure. FIG. 1B is an isometric view from the top of the inductor/base assembly of FIG. 1A. The assembly 100 includes an inductor 110, which as illustrated in FIGS. 1A and 1B is a DC common mode torroidal inductor. The inductor 110 is mounted in a base 120 which includes one or more lugs 130 in electrical communication with the windings of the inductor 110. The lugs 130 retain threaded elements 140, for example, nuts, in bodies 150 in the base 120. In other embodiments, the threaded elements 140 may be screws or bolts with a head that is retained in the bodies 150 of the base 120 and shafts which pass through the lugs 130. The combination of the lugs 130 and threaded elements 140 form electrical contacts for the inductor 110 in the base 120. The bodies 150 are, in some embodiments, substantially cylindrical upright bodies which may be substantially hollow and may include one or more features, for example, one or more flattened inner walls which prevent rotation of the threaded elements 140 within the bodies 150. The threaded elements 140 are in some embodiments free to move or "float" up and down through the internal volume of the bodies 150 while being retained within the internal volume of the bodies by the lugs 130. The base 120 also includes a groove 160 in which a gasket 170 is disposed. The bodies 150 retaining the threaded elements 140 may be disposed in a lower section 180 of the base which extends in a lower direction to a greater degree than an upper section 190 of the base. The groove 160 may be formed on a lower surface 195 of the upper section 190 of the base and may circumscribe a perimeter of the lower section 180. The inductor 110 may be secured in an upper recess 210 of the base with a potting material 220. The potting material may include, for example, a polymeric material such as RTV, epoxy, polyurethane, or any other suitable potting material. As illustrated in FIG. 1A, the inductor 110 may be secured in the potting material 220 at only a lower portion thereof, facilitating air to circulate over the majority of the inductor which is not covered by potting material 220. The base 120 may further include one or more apertures 230 which may facilitate attachment of the base 120 to a wall of a plenum (FIGS. 8-11) with appropriate fasteners. The apertures 230 may be formed in protrusions 240 extending from sidewalls 250 of either the upper section 190 or lower section 180 of the base. The lower portion 180 of the base 120 may extend in a lower direction beyond a position of the protrusions 240 on the base 120.

Figure 2A:
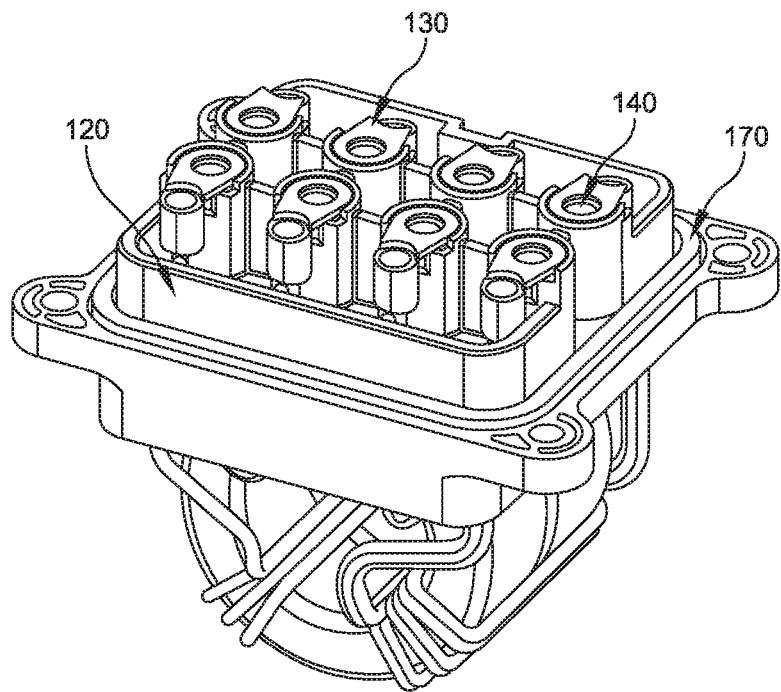
FIG. 2A is an isometric view from a bottom of another inductor/base assembly in accordance with an embodiment.
Figure 2B:
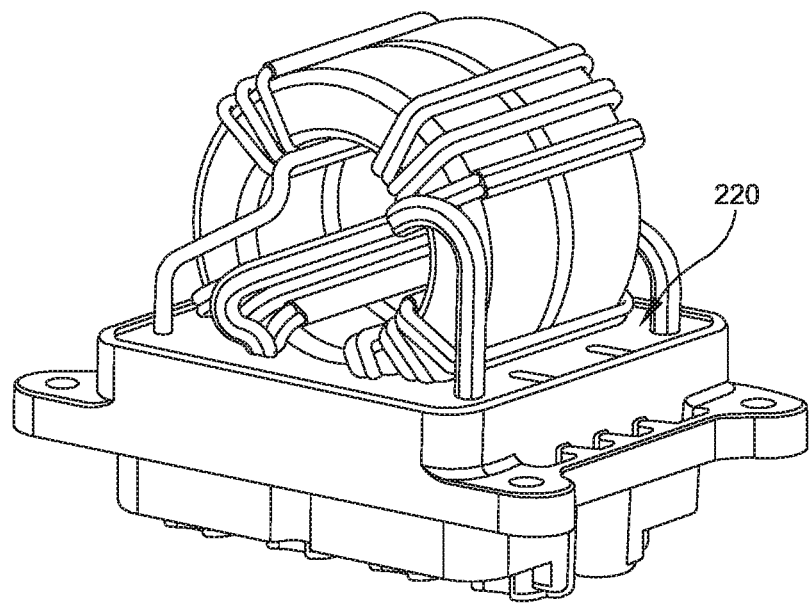
FIG. 2B is an isometric view from a top of the inductor/base assembly of FIG. 2A.
Figure 3A:
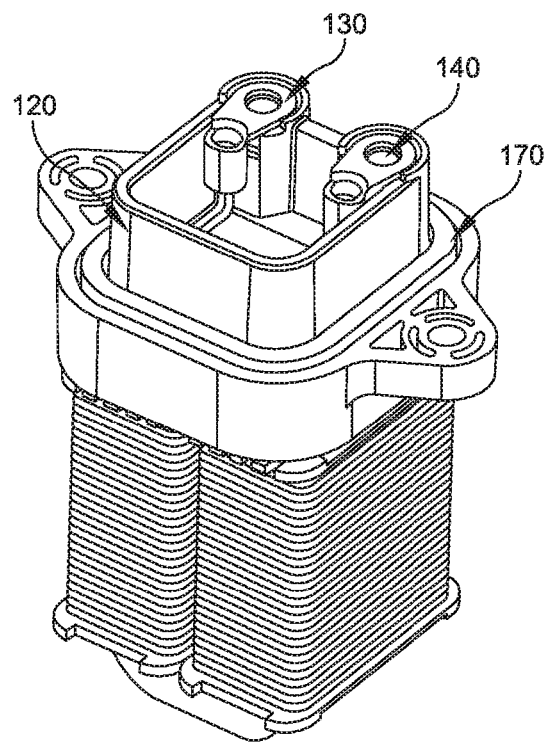
FIG. 3A is an isometric view from a bottom of another inductor/base assembly in accordance with an embodiment.
Figure 3B:
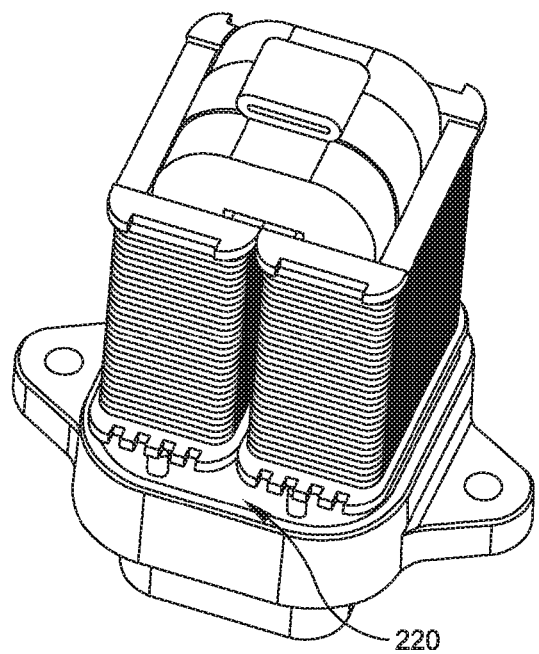
FIG. 3B is an isometric view from a top of the inductor/base assembly of FIG. 3A.
Figure 4A:
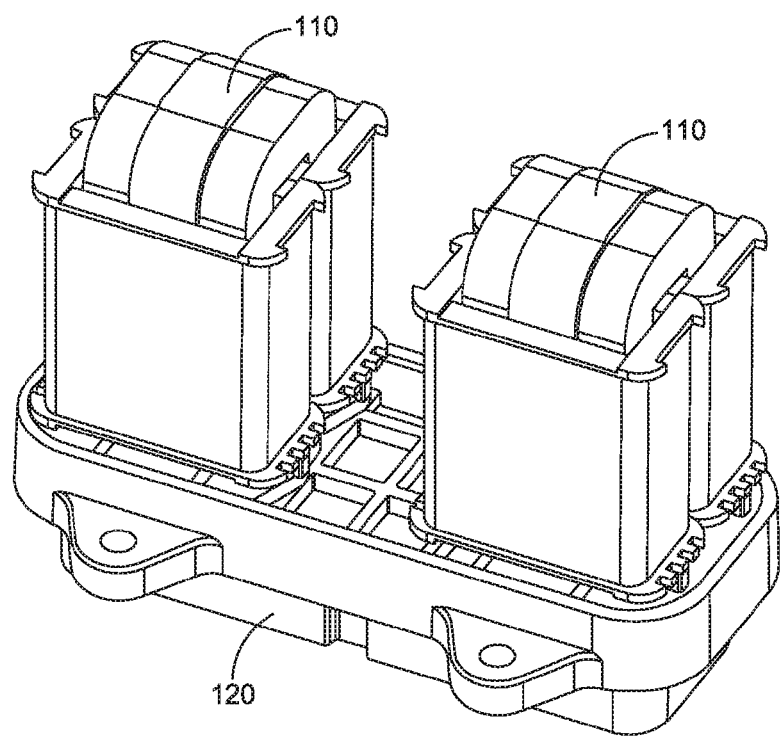
FIG. 4A is an isometric view from a top of another inductor/base assembly in accordance with an embodiment.
Figure 4B:
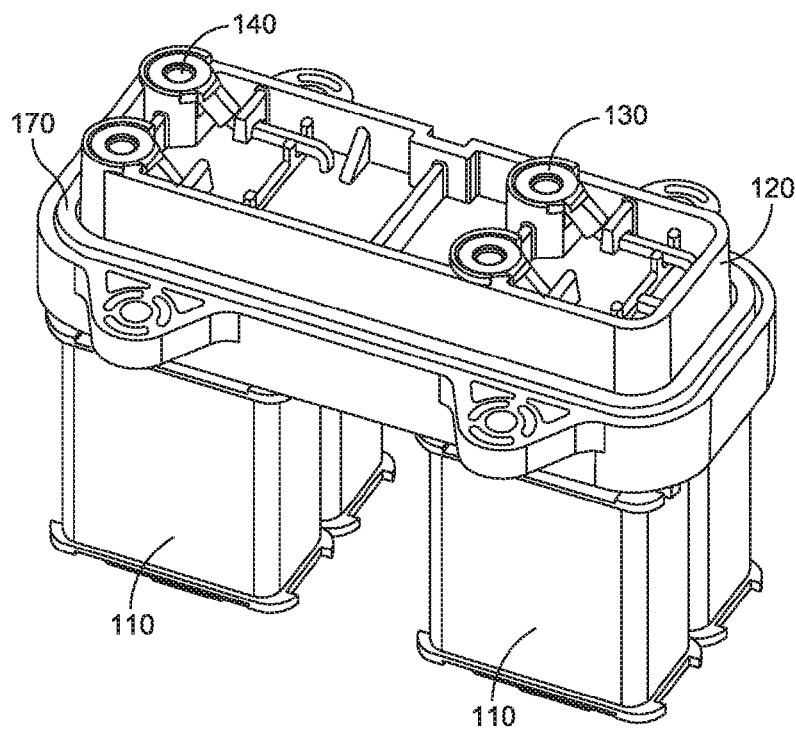
FIG. 4B is an isometric view from a bottom of the inductor/base assembly of FIG. 4A.

In some embodiments, the base 120 may include four electrical contacts (for example, four sets of lugs 130 and threaded elements 140), but in other embodiments, for example, as illustrated in FIGS. 2A and 2B, which illustrate an AC common mode inductor mounted in a base 120, the base 120 may include a greater number of electrical contacts, for example, eight. Other embodiments may include greater or fewer numbers of electrical contacts depending upon what type and how many electrical components are mounted in the base 120. For example, FIGS. 3A and 3B illustrate a C-core inductor including two electrical contacts mounted in a base 120. Further, as illustrated in FIGS. 4A and 4B, multiple electrical components, for example, two C-core inductors 110, may be mounted in a common base 120.

Figure 5:
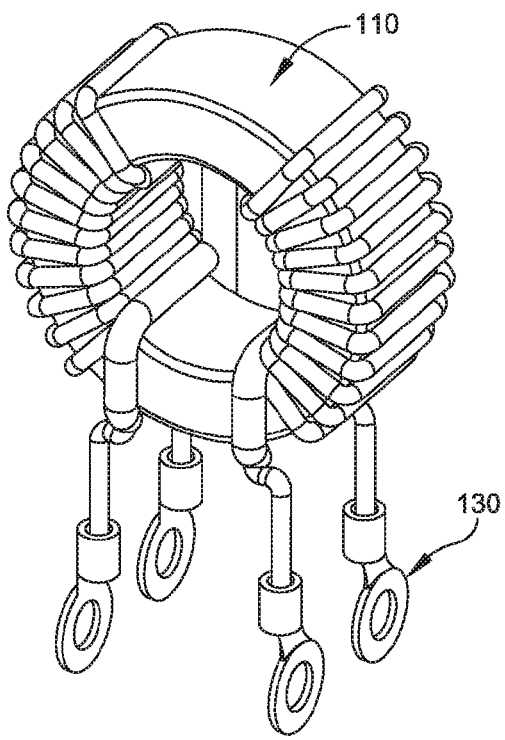
FIG. 5 is an isometric view of an inductor.
Figure 6:
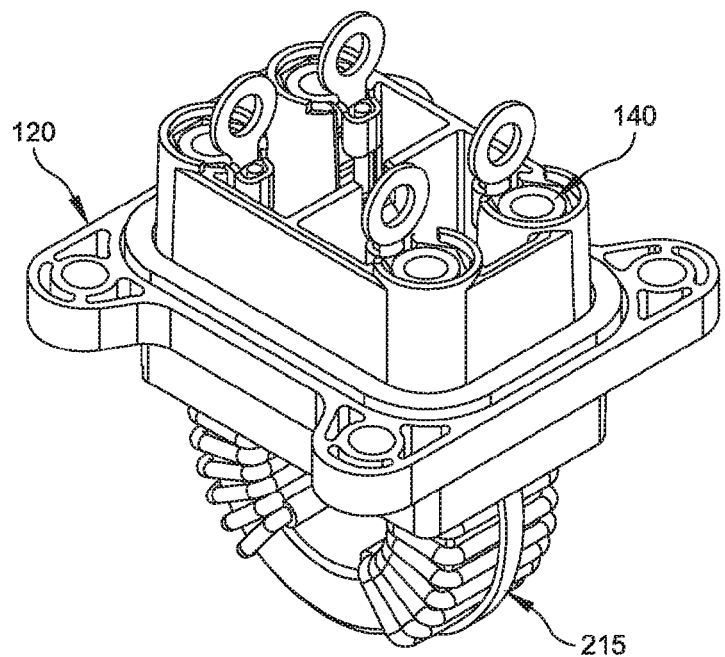
FIG. 6 is an isometric view of the inductor of FIG. 5 inserted into a base in accordance with an embodiment.

To form an inductor and base combination as illustrated in, for example, FIGS. 1A and 1B above, the inductor 110 is provided or wound per the electrical requirements of the electrical system in which it is to be installed. Wire ends of the windings of the inductor 110 are terminated with ring lugs 130 either prior to or after inserting into base as shown in FIG. 5. The wound inductor 110 is placed into the base 120. Threaded elements 140, for example, hex nuts, are placed into the bodies 150, which may function as nut retainers. The bodies 150 prevent the threaded elements 140 from turning about their axes but allow the threaded elements 140 to move freely along their axes. An optional cable tie 215 (FIG. 6) may be utilized to secure the inductor 110 in the recess 210 of the base prior to potting.

Figure 7:
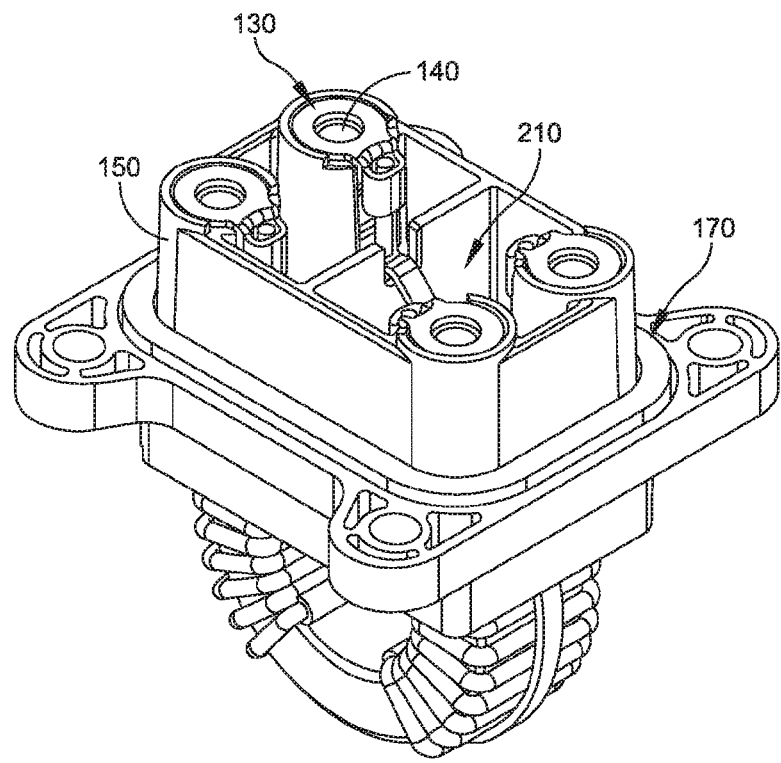
FIG. 7 is an isometric view of the inductor of FIG. 5 inserted into the base of FIG. 6 and having lugs disposed over floating electrical connector retaining bodies.

As shown in FIG. 7, the lugs 130 are then bent 90 degrees, covering the openings of the bodies 150 and making the threaded elements 140 captive within the bodies 150. The interior recess 210 of the base is potted to secure the inductor to the base and also to create a seal between the sides of the inductor assembly. The potting material 220 (see, for example, FIG. 1B) may also prevent air from passing from a plenum side of an electrical enclosure through the base 120 and contaminating or delivering heat to an environmentally controlled and/or cleanliness controlled circuit board side of the electrical enclosure. A gasket 170 is installed in the gasket groove 160 located on the mounting surface. The finished inductor/base assembly resembles that illustrated in FIGS. 1A and 1B.

Figure 8:
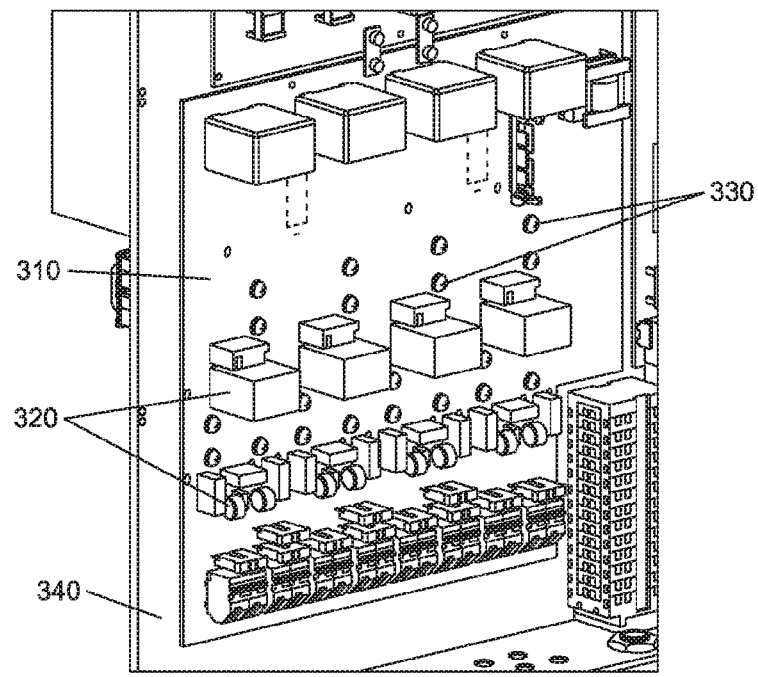
FIG. 8 is an embodiment of a circuit board disposed on an enclosure partition.

The inductor/base assembly 100 may then be installed in an electrical system, for example, in a first plenum side of an electrical system enclosure as described above. FIG. 8 illustrates a circuit board 310 including numerous electrical and/or electronic components 320 mounted on the circuit board 310. The circuit board 310 also includes a plurality of electrical landings 330, for example, solder pads, to which the electrical connectors of inductor/base assemblies 100 may be electrically coupled. The circuit board 310 is disposed in a "clean" second enclosure section of an electrical enclosure and mounted on an enclosure partition 340 separating the second enclosure section from the first enclosure section including a plenum in which the inductor/base assemblies 100 may be mounted. The second enclosure section may be enclosed in a sealed compartment (not shown) provided with fan(s), filters(s), or other components which may be utilized to maintain the environment in the first enclosure section in a desired condition, for example, within a desired temperature and/or humidity range and/or range of concentration of airborne particulates.

Figure 9:
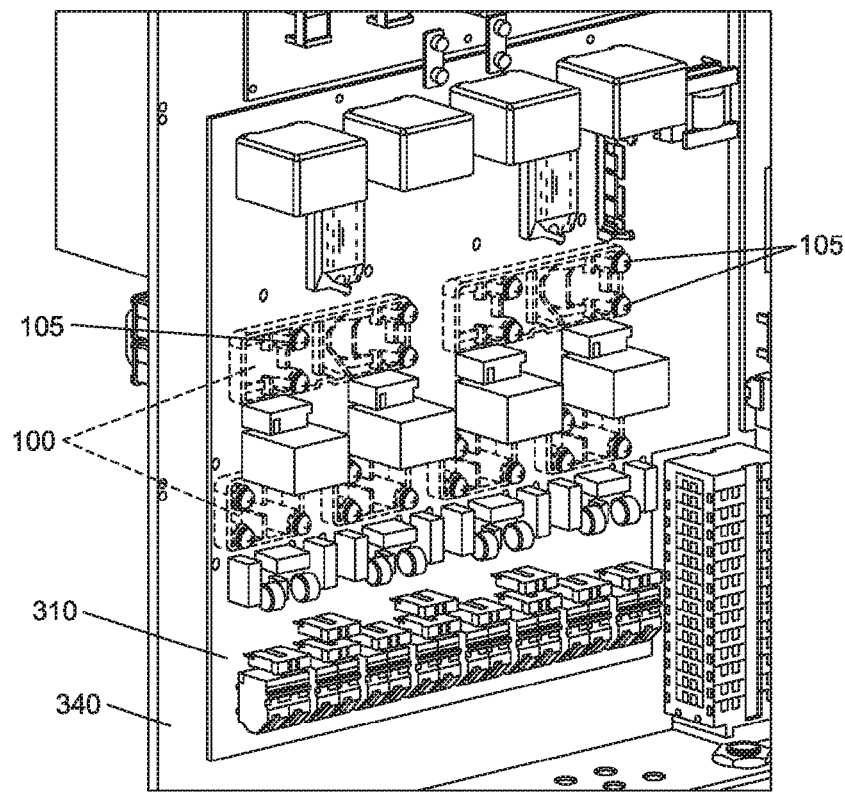
FIG. 9 illustrates embodiments of inductor base/assemblies in electrical connection with the circuit board of FIG. 8.

FIG. 9 illustrates the electrical assembly from the side of the second enclosure section, with the circuit board 310 illustrated as transparent to show how the inductor/base assemblies 100 are mounted. The inductor/base assemblies 100 are installed from the plenum side of the enclosure and secured to the enclosure partition 340 by threaded connectors 105, for example, bolts or screws, which pass through apertures in the electrical landings 330 (see FIG. 8) and the circuit board 310, and engage the threaded elements 140 in the bases 120 (see FIG. 4B). In some embodiments where the threaded elements 140 in the bases 120 comprise male threaded elements, for example, bolts or screws, the threaded connectors 105 may comprise nuts which engage the threaded elements 140 on the circuit board side of the enclosure. Tightening of the threaded connectors 105 draws the inductor/base assemblies 100 against the plenum side of the enclosure partition 340 and provides for upper portions, for example, heads of the threaded connectors 105 to contact the electrical landings 330. The threaded connectors 105 are in some embodiments electrically conductive and provide electrical communication between the electrical landings 330 and corresponding electrical connectors on the inductor/base assemblies 100. In other embodiments, electrical connection is made when tightening of the threaded connectors 105 pulls the captive threaded elements 140 and ring lugs 130 in the bases 120 (see FIG. 4B) tightly into contact with a solder pad surrounding the aperture in the circuit board 310 on a side of the circuit board facing the enclosure partition 340. In other embodiments, the threaded connectors 105 and threaded elements 140 are replaced with other forms of electrical connectors, for example, friction connectors such as banana connectors or RCA connectors to provide the electrical connection between the electrical landings 330 and electrical contacts of the inductor/base assemblies 100.

The integrated gaskets 170 in the bases 120 (see FIG. 4B) provide hermetic seals against the plenum side of the enclosure partition 340. These hermetic seals may prevent "dirty" air from the plenum from passing through the apertures in the electrical landings 330 or enclosure partition 340 and may facilitate maintaining the electronic side (the second enclosure section) of the enclosure at a desired level of cleanliness, for example, at an IP54 particle and moisture protection level.

Figure 10:
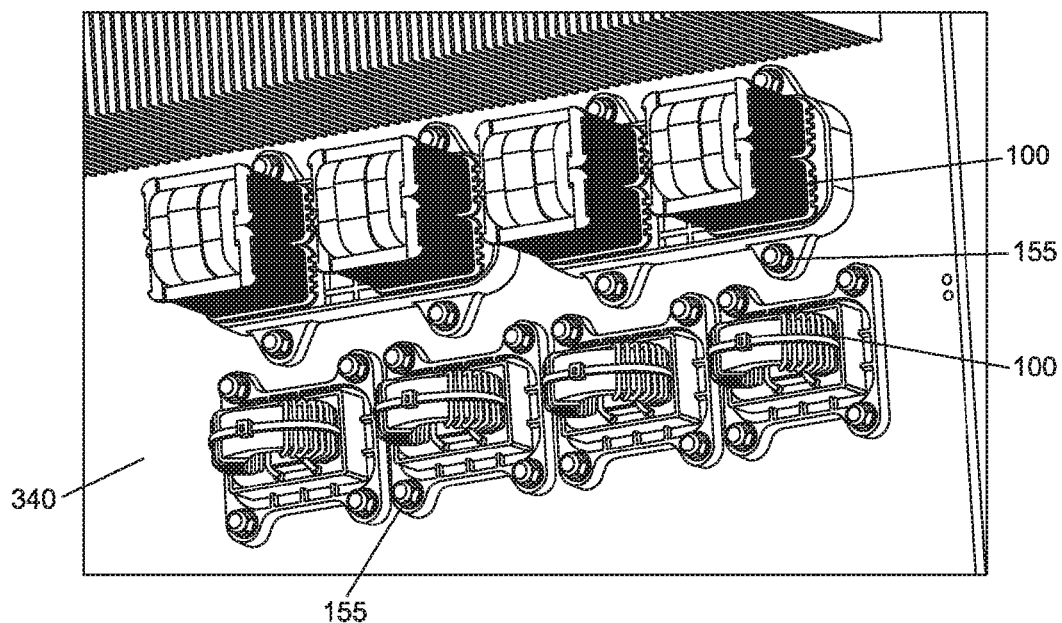
FIG. 10 illustrates the inductor/base assemblies of FIG. 9 mounted to the enclosure partition of FIG. 8.

FIG. 10 illustrates a plurality of inductor/base assemblies 100 mounted on a plenum side of the enclosure partition 340. The inductor/base assemblies 100 may be secured to the enclosure partition 340 by connectors 155, for example, screws, bolts, or other connectors known in the art, which pass through the apertures 230 formed in the protrusions 240 extending from the sidewalls 250 of the bases 120. The connectors 155 in some embodiments pass through apertures in the enclosure partition 340 and engage corresponding retaining elements, for example, nuts, pins, clips, or other fasteners known in the art in the second enclosure section, for example, disposed on or proximate a surface of the enclosure partition 340. In other embodiments, the connectors 155 may pass from the second enclosure section through apertures in the enclosure partition and through the apertures 230 and be secured by retaining elements, for example, nuts, pins, clips, or other fasteners known in the art on the plenum side against the protrusions 240. In further embodiments, the connectors 155 engage retaining elements secured to the plenum side of the enclosure partition 340.

Figure 11:
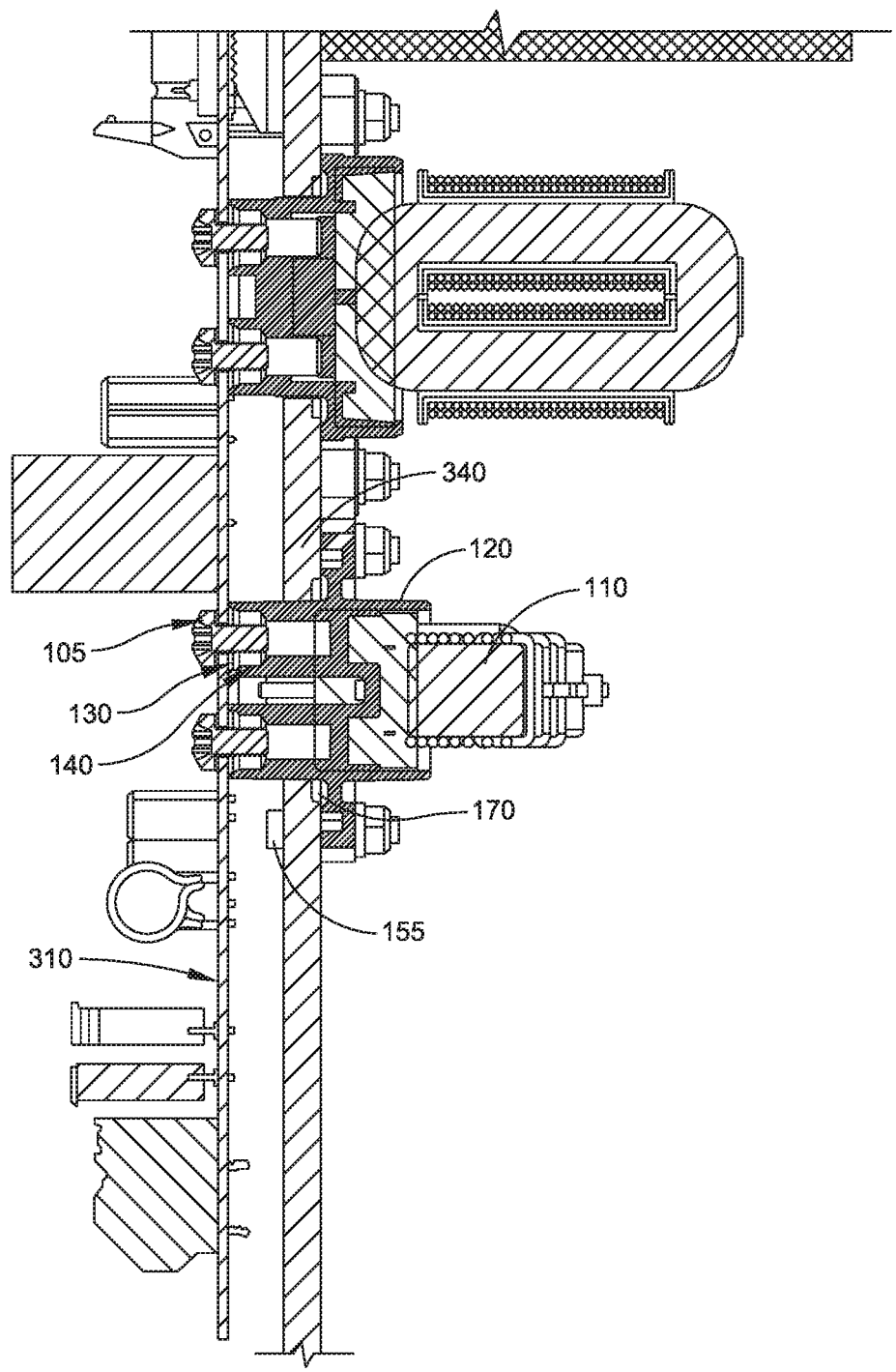
FIG. 11 is a cross-sectional view of an embodiment of an electrical assembly.

FIG. 11 is a side view of the assembled electronic assembly including mounted inductor/base assemblies 100 and circuit board 310 secured to an enclosure partition 340. As illustrated, a lower portion of the bases 120 of the inductors 110 passes through the enclosure partition 340. The threaded connectors 105 engage the threaded elements 140 and provide electrical communication between the lugs 130 and the circuit board 310 (see, for example FIG. 1A).

Connectors 155 retain the bases 120 against the plenum-side wall of the enclosure partition 340 providing for the gaskets 170 to form a seal about the apertures in the enclosure partition 340 through which the bases pass. Connectors 155 may include bolts passing through the enclosure partition 340 and apertures 230 in the bases which engage washers and nuts disposed against the protrusion 240 in which the aperture 230 is formed (see FIG. 1B) as illustrated in FIG. 11. Alternately, the connectors 155 may pass from the plenum side through the enclosure partition 340 and engage nuts on the circuit board side. Further, the connectors 155 may pass through the apertures 230 in the bases and engage threaded holes in the enclosure partition 340. In further embodiments, connectors 155 may include threaded connectors welded or otherwise secured to a surface of the enclosure partition 340 which pass though the apertures 230 in the bases and engage washers and nuts disposed against the protrusion 240 in which the aperture 230 is formed.

As illustrated in FIG. 11 a space may be defined between the circuit board 310 and the enclosure partition 340. This space may facilitate insulating the circuit board 310 and the components mounted on the circuit board from heat generated by the inductors 110.

It should be recognized that alternative connectors may be utilized to retain the base/inductor assemblies 100 against the enclosure partition 340 or provide electrical communication between the inductors and the circuit board. These connectors may include, for example, cam locks, plug and receptacle connectors, binding post connectors, or other connectors known in the art. Further, the base/inductor assemblies 100 may be biased against the enclosure partition 340 to facilitate forming a seal with the gaskets 170 by biasing elements other than the threaded connectors 155. For example, the base/inductor assemblies 100 may be biased against the enclosure partition 340 by one or more springs or other resilient elements. Similarly, the circuit board 310 may be biased against the bases 120 of the base/inductor assemblies 100 by one or more springs or other resilient elements.

Embodiments of the present disclosure are also directed to methods of assembling electrical systems. Some embodiments may include forming or obtaining a heat-generating electrical component, for example, an inductor 110 as illustrated in any of FIGS. 1-7 and forming or obtaining a base for mounting the heat-generating component, for example a base 120 as illustrated in any of FIGS. 1-7. The heat-generating electrical component may be mounted in a recess of the base and secured in the base with a potting material 220 (see FIG. 2B). Floating electrical connectors 140 may be placed into retaining bodies 150 formed in the base and secured or captured within the retaining bodies by disposing a lug 130 secured to an end of an electrical lead of the heat-generating electrical component over openings of the retaining bodies (see, for example, FIG. 1A). The base may be provided with a gasket 170 which may be disposed within a groove 195 formed in a lower surface of a ledge or shelf extending about and circumscribing sidewalls of the base (see, for example, FIG. 1A). The method may further include mounting the base including the heat-generating electrical component to a first side of an electrical assembly enclosure partition and mounting a circuit board to a second side of the electrical assembly enclosure partition (See FIG. 11). The method may further include electrically connecting the floating electrical connectors to electrical connections on the circuit board, for example, with a connecting element passing through an aperture in the circuit board and engaging the floating electrical connector.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An electronics system comprising:
an enclosure including a first side and a second side separated from the first side by an enclosure partition;
a heat-generating electrical component disposed in the first side of the enclosure, the first side of the enclosure being a plenum open to atmosphere and configured to facilitate cooling air to contact and circulate over the heat-generating electrical component, the heat-generating electrical component mounted in a base including a floating electrical connector, the floating electrical connector including a lug/captive nut assembly having a nut retained within a substantially cylindrical body formed in the base by a ring-shaped lug, the ring-shaped lug being secured to an end of an electrical lead of the heat-generating electrical component, the nut being free to move up and down through an internal volume of the substantially cylindrical body along an axis of the substantially cylindrical body while being retained within the internal volume by the ring-shaped lug; and
a circuit board including a plurality of electronic components disposed in the second side of the enclosure and in electrical communication with the heat-generating electrical component by an electrical conductor passing through the enclosure partition and the ring-shaped lug and engaging the nut.

2. The system of claim 1, wherein the second side is a climate controlled region.

3. The system of claim 1, wherein the base includes a groove housing a gasket configured to form a hermetic seal with the enclosure partition.

4. The system of claim 3, wherein the groove circumscribes a lower portion of the base which includes the lug/captive nut.

5. The system of claim 4, wherein the lower portion passes through an aperture in the enclosure partition.

6. The system of claim 5, wherein the heat-generating electrical component is disposed in a recess in an upper portion of the base and retained therein with a potting material.

7. The system of claim 6, wherein the base includes an aperture formed in a protrusion extending from a sidewall of the base, the aperture configured to retain a connector securing the base to the enclosure partition.

8. The system of claim 7, including a plurality of heat-generating electrical components mounted in a common base.

9. The system of claim 8, wherein the electrical conductor is in electrical communication with a solder pad on a surface of the circuit board.

10. The system of claim 9, wherein the electrical conductor comprises a threaded connector.

11. The system of claim 10, wherein the heat-generating electrical component comprises an inductor.

12. The system of claim 6, wherein the heat-generating electrical component is retained in the potting material at only a lower portion thereof, a majority of the heat-generating electrical component not being covered by the potting material.

13. The system of claim 1, wherein a space is defined between the circuit board and the enclosure partition.

14. The system of claim 1, wherein the ring-shaped lug is configured to bend from a position in which the ring-shaped lug does not obstruct an opening in the substantially cylindrical body, such that the nut may be inserted into the internal volume of the substantially cylindrical body through the opening, to a position in which the ring-shaped lug covers the opening and makes the nut captive within the internal volume of the substantially cylindrical body.

15. The system of claim 9, wherein the electrical conductor is a threaded connector having a head in contact with the solder pad on the surface of the circuit board.

\* \* \* \* \*